United States Patent [19]

Kerber et al.

[11] Patent Number: 4,462,012
[45] Date of Patent: Jul. 24, 1984

[54] COMBINATION LOW INDUCTANCE FUSE AND ELECTROMAGNETIC NOISE FILTER

[75] Inventors: George L. Kerber; William D. Squire, both of San Diego, Calif.

[73] Assignee: GTI Corporation, San Diego, Calif.

[21] Appl. No.: 273,798

[22] Filed: Jun. 15, 1981

[51] Int. Cl.³ .............................................. H03H 7/01
[52] U.S. Cl. ..................................... 333/167; 333/12; 333/181; 333/185
[58] Field of Search ............... 333/167, 185, 181–184, 333/12; 361/272, 275, 408; 339/14 R, 14 L, 28, 29 R, 93 R

[56] References Cited

U.S. PATENT DOCUMENTS

| | | | |
|---|---|---|---|
| 2,709,761 | 5/1955 | Potter | 361/272 X |
| 2,777,998 | 1/1957 | Shepherd | 333/167 |
| 3,329,911 | 7/1967 | Schlicke et al. | 333/184 X |
| 3,745,513 | 7/1973 | Gross | 361/408 X |
| 3,815,073 | 6/1974 | Pollmeier et al. | 361/275 |
| 4,107,759 | 8/1978 | Shirn et al. | 361/275 |

OTHER PUBLICATIONS

"Electronic Shortcuts for Hobbyists", Sylvania Electric Products, Inc., New York, N.Y., Copyright 1951; pp. 11 and 22.
Ficchi–"Electrical Interference," Hayden Book Company, Inc., New York, 1964; Title page & pp. 48–59.

Primary Examiner—Marvin L. Nussbaum
Attorney, Agent, or Firm—Webb, Burden, Robinson & Webb

[57] ABSTRACT

A high performance, low cost filter having a capacitor electrically connected therein to effectively block electromagnetic noise signals that are generated by certain electrical and electromechanical devices, including an electric motor, such as that commonly associated with either of the engine of a motor vehicle or a household appliance. In one embodiment of the invention, the filter is provided in combination with a fuse link that is particularly structured to have both relatively low inductance and low fusing current characteristics. The capacitor and the fuse link may be contained within a filter housing. Moreover, both the capacitor and the fuse link may be flexibly mounted within the filter housing, to thereby reduce the application of mechanical stresses and minimize the likelihood of possible damage thereto during the handling and installation of the filter. In the assembled relationship, the filter housing is particularly structured so that a portion thereof containing the capacitor can be located exterior to the housing of the electrical or electromechanical device from which electromagnetic noise is generated, so as to reduce the amount of heat to which the filter capacitor is subjected during operation of the device. In another embodiment of the invention, a low inductance fuse is fabricated (apart from in combination with the aforementioned filter) by means of strip line transmission line techniques and interconnected between a source and a load of an electrical or electromechanical system.

1 Claim, 5 Drawing Figures

COMBINATION LOW INDUCTANCE FUSE AND ELECTROMAGNETIC NOISE FILTER

BACKGROUND OF THE INVENTION

1. Field of the Invention

This invention relates to a low cost, fuse and filter combination, a portion of which may be located exterior to an electrical or electromechanical device (e.g. an electric motor), so as to block undesirable electromagnetic noise signals and be less susceptible to the adverse effects of heat being produced as a consequence of the operation of the device.

2. Prior Art

As will be known to those skilled in the art, various electrical and electromechanical devices, such as, for example, an electric motor, an alternator, a solenoid, a magnetic clutch, a heater motor, and the like devices, which are commonly associated with either of the engine of a motor vehicle or a household appliance, undesirably generate spurious electromagnetic noise signals. More particularly, current fluctuations in the electrical system of a motor vehicle sometimes cause corresponding electromagnetic energy to be conducted through the wiring harness to be radiated therefrom as electromagnetic noise. Such noise signals frequently interfere with the reception of certain radio frequencies, so that a radio program may consequently become inaudible to the passengers in the motor vehicle. What is more, the operation of many household appliances also produces noise signals that are known to cause interference with the reception of radio and television signals in the home. Accordingly, various filter embodiments, including noise suppression capacitors or condensers, have been employed in an attempt to eliminate the electromagnetic effects of the noise signals. However, and as a result of the non-integral (i.e. add-on) relationship of the filter to the device as well as the relatively high cost of filter fabrication (with respect to performance), the prior art noise filters have not been economically efficient in reducing the undesirable effects of electromagnetic noise signals being generated by electrical and electromechanical devices.

More particularly, some conventional electromagnetic noise filters have heretofor been mounted within the housing of the electrical or electromechanical device from which an undesirable supply of noise signals is known to emanate. However, when the electrical or electromechanical device is an electric motor, or the like, the aforementioned interior location of the filter commonly causes the filter and its components to be undesirably susceptible to the adverse effects of heat produced during motor operation. Moreover, it has also been typical in other examples of the prior art for a filter capacitor to be rigidly affixed to an extension of the filter housing. By way of yet another prior art example, the capacitor has also been known to be rigidly molded into the motor vehicle wiring harness. However, and as a result of the aforementioned rigid capacitor placement, various stresses and strains to which the filter is subjected during handling and installation are transmitted to the capacitor. Hence, the capacitor has been known to fracture, thereby requiring that the filter unit be replaced and scrapped. What is even more, such damage to the capacitor could result in a short circuit thereof and a possible interruption in the operation of the electrical or electromechanical device as a result of a current overage and a corresponding rupture of the fuse associated with the device.

Accordingly, some electromagnetic noise filters have been provided with a fuse member that is adapted to rupture in the event that the filter is exposed to a relatively large current overage. However, because of the generally large size and corresponding inductance that are characteristic of the fuse member, the conventional noise filters have not been particularly suitable for applications wherein either relatively low fusing currents may be encountered or when high frequency performance (as in the FM or CB bands) is required.

SUMMARY OF THE INVENTION

Accordingly, it is a primary object of the present invention to provide a high performance, low cost filter having a capacitor electrically connected therein to block electromagnetic noise signals that are generated by an electrical or electromechanical device (e.g. an electric motor) to thereby minimize the undesirable effects (e.g. interference with the reception of radio or television signals in a motor vehicle or the home) produced by the noise.

It is another object of the present invention to enclose or encapsulate the capacitor within the housing of the filter, so as to better protect the capacitor from physical abuse.

It is still another object of the present invention to provide a flexible electrical connection of the capacitor within the filter housing, whereby mechanical stresses might be absorbed during the handling and installation of the filter so that the reliability and useful life of the capacitor will be extended.

It is yet an additional object of the present invention to provide the filter with a particular housing configuration, so that a portion of the filter housing can be located exterior to the housing of the electrical or electromechanical device, whereby to minimize the adverse effects of heat generated by the device during continuous operation thereof.

DESCRIPTION OF THE PREFERRED EMBODIMENTS

Figure 1:
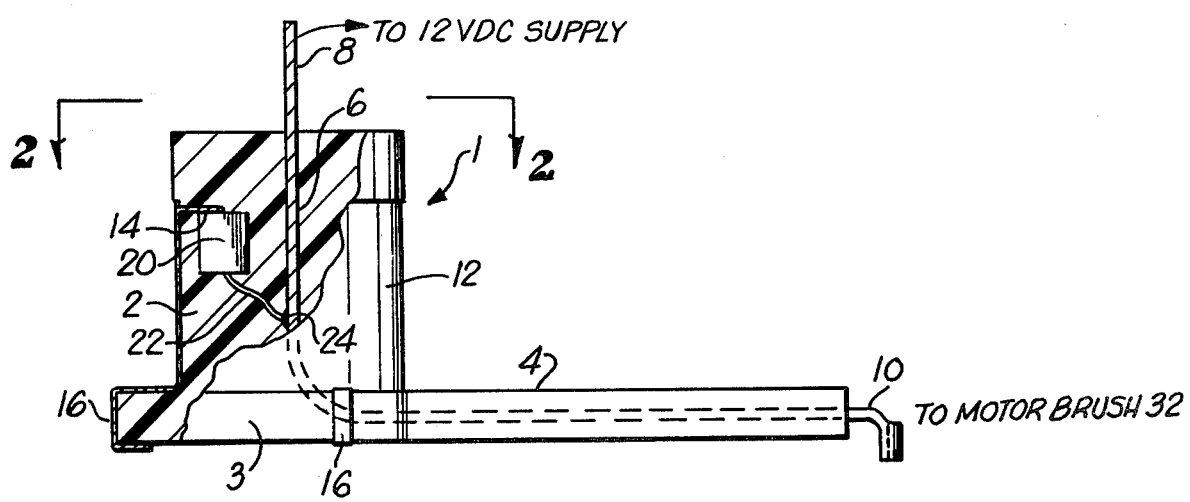
FIG. 1 shows a partial cross section of an electromagnetic noise filter which forms a first preferred embodiment of the present invention.
Figure 2:
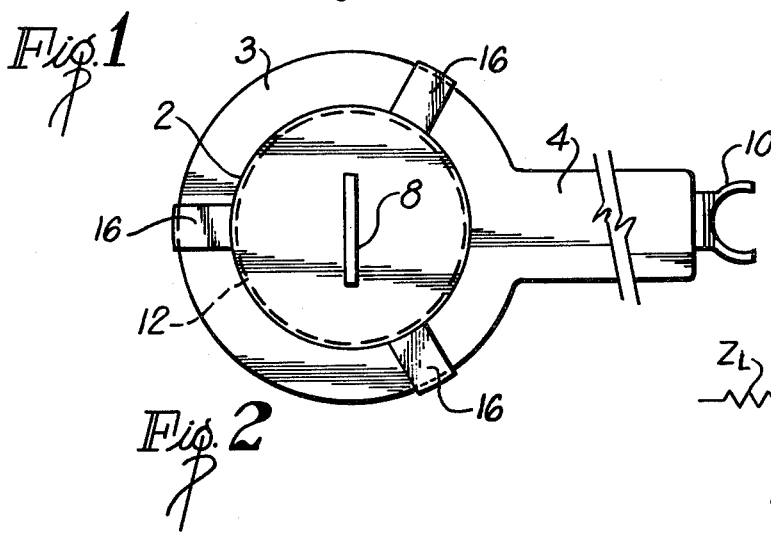
FIG. 2 shows a top view of the filter embodiment of FIG. 1.
Figure 5:
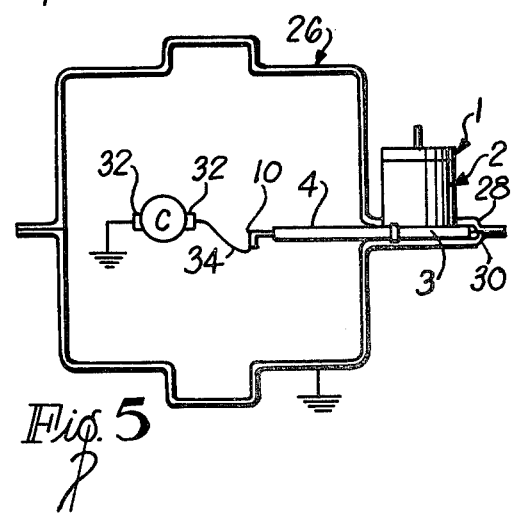
FIG. 5 is illustrative of the physical and electrical interconnection of the filter embodiment of FIGS. 1 and 2 exterior to the housing of an electric motor, or the like electrical or electromechanical device.

An electromagnetic noise filter 1 which forms a first preferred embodiment of the present invention is now described while referring concurrently to FIGS. 1 and 2 of the drawings. Filter 1 comprises a cylindrical housing 2, a flat, circular base member 3, and an elongated arm member 4. Housing 2, base member 3 and arm member 4 are coextensively connected to one another. That is, housing 2 projects upwardly while arm member 4 projects outwardly from base member 3. The diameter of base member 3 is larger than that of housing 2, so that, as will be explained in greater detail when referring to FIG. 5, base member 3 may be received at the housing of an electrical or electromechanical device. Filter housing 2 is typically fabricated from an insulating material, such as a well-known molded plastic material (e.g. polypropylene). Housing 2 may be formed by a conventional injection molding technique, or the like.

Extending through the housing 2 and arm member 4 of filter 1 is a continuous strip 6 of electrically conductive material, such as brass, or the like. One end of conductive strip 6 extends through the top of cylindrical housing 2, whereby to form a first terminal 8. In the assembled relationship, terminal 8 is adapted to be electrically connected to a 12 volt dc source of supply, such as at the battery of a motor vehicle. The other end of conductor strip 6 projects outwardly from the end of arm member 4, whereby to form a second terminal 10. In the assembled relationship, terminal 10 is adapted to be electrically connected to an electrical or electromechanical device, which device is known to generate undesirable electromagnetic noise signals. By way of one example, the device to which terminal 10 is to be connected may be a conventional electric motor, such as an alternator or heater motor commonly associated with either of the engine of a motor vehicle or a household appliance.

Figure 3:
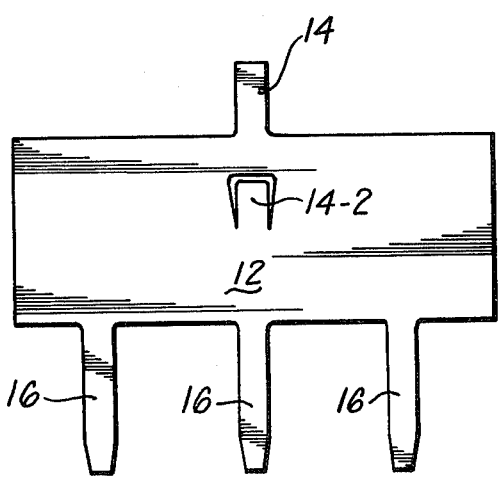
FIG. 3 illustrates the wound conductive foil of the filter embodiment of FIGS. 1 and 2 in an unwound configuration.

A grounding foil 12 is wound around some or all of the exterior of cylindrical filter housing 2. Grounding foil 12 is fabricated from an electrically conductive material, such as copper, tin, zinc, or the like. As is best shown in FIG. 3 of the drawings, in its unwound configuration, the grounding foil 12 comprises an elongated, flat strip. Extending from the top of grounding foil 12 is a fuse link tab 14. Extending from the bottom of grounding foil 12 are one or more (e.g. three) grounding tabs 16. Each of the fuse link 14 and the grounding tabs 16 preferably comprises relatively thin, flat, and electrically conductive projections that extend outwardly from opposite ends of the elongated strip of grounding foil 12. The precise dimensions of fuse link 14 are selected so that the width-to-thickness ratio thereof will result in electrically suitable fusing current and inductance characteristics. More particularly, fuse link 14 is preferably fabricated with a short length to thereby minimize inductance and, accordingly, improve the filtering performance in the FM and CB frequency bands. Moreover, fuse link 14 is also made relatively thin, so as to be suitably responsive to a current overage. By way of specific example, fuse link 14 may be 50 mils long, 20 mils wide, and 5 mils thick, whereby to be adapted to respond to a fusing current of approximately 20 amps.

Referring once again to FIGS. 1 and 2, the grounding foil 12 is shown wound around the outside of filter housing 2, with each of the grounding tabs 16 thereof being folded under the filter base 3. As will be better described when referring hereinafter to FIG. 5 of the drawings, each of the grounding tabs 16 is connected to electrical ground when the filter 1 of the present embodiment is installed in the assembled relationship at the housing of an electrical or electromechanical device. The fuse link 14 is folded and inserted through the plastic material of housing 2, so as to be electrically connected to one terminal of a filter capacitor 20. Fuse link 14 is provided to prevent the electrical or electromechanical device from suffering an interruption thereof (i.e. such as that caused by a current overage and a corresponding rupture of the fuse associated with the electrical or electromechanical) in the event that capacitor 20 should fail (i.e. become short circuited) as the result of a fracture, or the like.

In accordance with one improvement provided by the present invention, both of the fuse link 14 and capacitor 20 are enclosed (i.e. encapsulated) within the plastic material of housing 2. However, and as will be described hereinafter, the fuse link 14 and capacitor 20 may also be disposed within a hollow cavity formed at the interior of filter housing 2. Capacitor 20 is typically a 0.2 microfarad chip capacitor characterized by an operating voltage of between 50 to 100 volts and a surge voltage of between 300 to 450 volts. In many noise filters of the prior art, capacitors were typically rigidly affixed to the filter at an elongated extension of the housing thereof, and conductive foil was then wrapped around both the capacitor and the extension. However, this prior art arrangement has proven to be unreliable, because the capacitor often fractured and failed when the elongated extension was flexed during handling or installation.

By virtue of the present invention, chip capacitor 20 is flexibly mounted within filter housing 2, so that a filter 1 of improved reliability and relatively low cost is provided. That is, the second terminal of chip capacitor 20 is connected to one end of a flexible ribbon 22. The second end of flexible ribbon 22 is attached (e.g. soldered or spot welded) to conductive strip 6 at an electrical junction 24. Flexible ribbon 22 is preferably fabricated from a wide, flat, and thin strip of conductive material (e.g. copper), in order to minimize the inductance thereof. By way of example, ribbon 22 is preferably 5 mils thick, so as to provide suitable flexibility. By electrically connecting chip capacitor 20 to conductive strip 6 via flexible ribbon 22, the structural and functional integrity of chip capacitor 20 can be better preserved. Thus, by virtue of its flexible nature, ribbon 22 is adapted to absorb mechanical stresses and strains and thereby prevent the fracture of capacitor 20 during handling and installation. Hence, and unlike the rigid capacitor assembly typical of filtering arrangements of the prior art, chip capacitor 20 is flexibly mounted within the filter housing 2, so that stresses and strains will be transferred away therefrom, whereby the life expectancy and reliability of filter 1 can be maximized.

Figure 4:
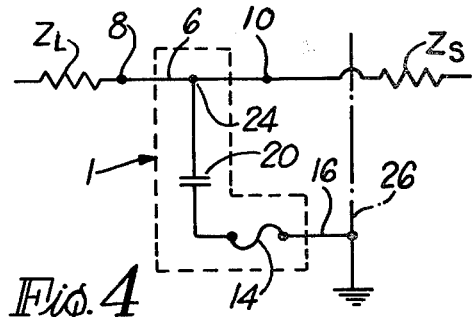
FIG. 4 is a schematic of the equivalent circuit of the filter embodiment of FIGS. 1 and 2.

A schematic of the equivalent circuit of the filter embodiment 1 of FIGS. 1 and 2 is illustrated in FIG. 4 of the drawings. More particularly, the circuit of filter 1 comprises the series interconnection of fuse link 14 and chip capacitor 20. One terminal of the aforementioned series circuit is connected to electrical ground (at the housing 26 of an electric or electromechanical device) via the grounding tabs 16 of grounding foil 12. The other terminal of the series circuit is connected to electrically conductive strip 6 at common electrical junction 24 (between the 12 volt dc source of supply and the brushes of the electric motor) with respective terminals of a source impedance, designated $Z_S$, and a load impedance, designated $Z_L$. Source impedance $Z_S$ is representative of a lumped impedance comprising, for example, the series inductances of the brush wire and commutator C of an electric motor plus the inductance of conductive strip 6. As will be known to those skilled in the art, the reactance of capacitor 20 decreases with increasing frequency. Therefore, capacitor 20 appears as a short circuit to high frequency signals and an opened circuit to very low frequency signals.

In accordance with another improvement of the present invention, the filter 1 is located exterior to the housing 26 of an electrical or electromechanical device that is known to produce undesirable electromagnetic noise signals. As will be recognized by those skilled in the art, some noise filters of the prior art have heretofor been positioned within the housing of the device. However, this prior art arrangement has proved to be unsuitable, because of the poor temperature coefficient of capacitance that is characteristic of available low cost chip capacitors. More particularly, the reliability and performance of both the conventional electromagnetic filter and a relatively low cost chip capacitor associated therewith diminish with increasing temperature (e.g. such as that caused by heat generated at the brushes of an electric motor). Accordingly, the mounting of a filter within the housing of a device, such as an electric motor, in many prior art filtering techniques, is likely to result in undesirable filter performance characteristics when the motor operates for relatively long periods of time at relatively high temperature conditions.

By virtue of the structure of filter housing 2, a portion of the electromagnetic noise filter 1 of the present embodiment can be suitably disposed outside of the housing 26 of an electric motor, whereby to enhance filter performance. More particularly, the extended flat base member 3 of filter 1 is retained between a pair of opposing flanges 28 and 30 which form motor housing 26. An aperture is formed in one of the opposing flanges (e.g. 28) and dimensioned to accommodate therethrough that portion of filter housing 2 in which the filter capacitor is housed. In the assembled relationship, the grounding tabs (designated 16 in FIGS. 1 and 2) of the filter grounding foil are positioned so as to be electrically connected to ground at the flanges 28 and 30 of motor housing 26. What is more, elongated arm member 4 extends into the interior of motor housing 26, so that the terminal 10 formed at the end thereof can be connected to the motor brushes 32 via a brush wire 34. Hence, by virtue of the present invention, and unlike that known in some conventional electromagnetic filtering arrangements, electromagnetic filter 1 is electrically interconnected with the brushes 32 of an electric motor, while the filter capacitor thereof is disposed exterior of the motor housing, whereby to advantageously enhance the performance characteristics of the filter by reducing the adverse influence of heat related effects.

We claim:

1. A filter for blocking electromagnetic noise signals which are generated in an electrical or electromechanical device from an electrical system of which it is a part, said filter comprising an electrical conductor for connecting the electrical or electromechanical device to the remainder of the system, a ceramic chip capacitor, a first electrically conductive flexible ribbon connected to said electrical conductor and one side of said chip capacitor, a second electrically conductive flexible ribbon electrically connected to the other side of said chip capacitor and extending away therefrom, a solid molded plastic housing encapsulating portions of the electrical conductor including the location where the first flexible ribbon is connected thereto, the chip capacitor and portion of the second ribbon, such that a portion of the second ribbon extends out of the housing for contacting a source of reference potential, whereby the plastic housing and flexible ribbons absorb mechanical forces without transmitting them to the chip capacitor.

* * * * *